United States Patent
Xu

(10) Patent No.: US 10,111,349 B2
(45) Date of Patent: Oct. 23, 2018

(54) BENDING ADJUSTMENT DEVICE AND RELATED FLEXIBLE DISPLAY DEVICE, AND MANUFACTURING METHOD THEREOF

(71) Applicant: BOE TECHNOLOGY GROUP CO., LTD., Beijing (CN)

(72) Inventor: Zhiqiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 15/502,823

(22) PCT Filed: Aug. 29, 2016

(86) PCT No.: PCT/CN2016/097085
§ 371 (c)(1),
(2) Date: Feb. 9, 2017

(87) PCT Pub. No.: WO2017/118052
PCT Pub. Date: Jul. 13, 2017

(65) Prior Publication Data
US 2018/0116061 A1    Apr. 26, 2018

(30) Foreign Application Priority Data

Jan. 4, 2016    (CN) .......................... 2016 1 0003788

(51) Int. Cl.
*H05K 5/02*    (2006.01)
*H05K 5/00*    (2006.01)

(52) U.S. Cl.
CPC ......... *H05K 5/0217* (2013.01); *H05K 5/0017* (2013.01)

(58) Field of Classification Search
CPC combination set(s) only.
See application file for complete search history.

(56) References Cited

U.S. PATENT DOCUMENTS 3,804,364 A * 4/1974 De Lepeleire .......... F01B 19/02
251/43
5,018,506 A   5/1991 Danna et al.
(Continued)

FOREIGN PATENT DOCUMENTS

CN    102525380 A    7/2012
CN    103800152      5/2014
(Continued)

OTHER PUBLICATIONS

Office Action from corresponding Chinese Application No. 201610003788.0, dated Jul. 24, 2017 (8 pages).
(Continued)

*Primary Examiner* — Lisa Lea Edmonds
(74) *Attorney, Agent, or Firm* — Harness, Dickey & Pierce, P.L.C.

(57) ABSTRACT

The disclosure provides a bending adjustment device, a related flexible display device, and a manufacturing method thereof. According to embodiments of the disclosure, the bending adjustment device comprises a plurality of conduits arranged in parallel. The bending adjustment device further comprises a plurality of air bags, wherein at least one air bag is disposed between the adjacent conduits of the plurality of conduits. The bending adjustment device further comprises at least one air sucking and charging apparatus connected to the plurality of conduits at their ends. The other ends of the conduits are closed. The air sucking and charging apparatus is configured to suck or charge air from or to the plurality of air bags through the plurality of conduits, such that the plurality of air bags expand and contract between the adjacent conduits.

20 Claims, 2 Drawing Sheets

(56) References Cited

U.S. PATENT DOCUMENTS

| | | | |
|---|---|---|---|
| 9,117,384 B2* | 8/2015 | Phillips | G06F 3/012 |
| 9,420,216 B2* | 8/2016 | Lee | G06K 9/00228 |
| 2005/0081711 A1* | 4/2005 | Kerekes | B62D 35/005 |
| | | | 92/48 |
| 2011/0193829 A1 | 8/2011 | Tsai et al. | |
| 2012/0092363 A1* | 4/2012 | Kim | G06T 5/006 |
| | | | 345/618 |
| 2012/0165609 A1 | 6/2012 | Liu et al. | |
| 2013/0114193 A1* | 5/2013 | Joo | F16M 11/08 |
| | | | 361/679.01 |
| 2014/0055429 A1* | 2/2014 | Kwon | G09G 3/001 |
| | | | 345/204 |
| 2017/0007475 A1 | 1/2017 | Lin et al. | |
| 2017/0105301 A1 | 4/2017 | Sun | |

FOREIGN PATENT DOCUMENTS

| | | |
|---|---|---|
| CN | 103943031 A | 7/2014 |
| CN | 104779111 | 7/2015 |
| CN | 104821138 | 8/2015 |
| CN | 104879023 A | 9/2015 |
| CN | 105044957 A | 11/2015 |
| CN | 105118401 A | 12/2015 |
| CN | 105160999 A | 12/2015 |
| CN | 105405363 A | 3/2016 |
| KR | 1020130050794 | 5/2013 |

OTHER PUBLICATIONS

Written Opinion of the International Searching Authority from corresponding PCT Application No. PCT/CN2016/097085, dated Dec. 7, 2016 (6 pages).

* cited by examiner

BENDING ADJUSTMENT DEVICE AND RELATED FLEXIBLE DISPLAY DEVICE, AND MANUFACTURING METHOD THEREOF

The present application claims the benefit and priority of the Chinese patent application No. 201610003788.0 filed on Jan. 4, 2016, the entire content of which is incorporated herein by reference.

TECHNICAL FIELD

Exemplary embodiments of the present disclosure relate to a bending adjustment device, related flexible display device, and a manufacturing method thereof.

BACKGROUND

This section is intended to introduce to the reader various aspects in the art, which may be related to various aspects of the present application, and this section is believed to be helpful in providing the reader with background information to facilitate a better understanding of the various aspects of the present application. Accordingly, it should be understood that these statements are to be read in this light, and not as admissions of the prior art.

With development of display technologies in recent years, flexible display technology gradually gets more and more attention. Compared with conventional display screens, a flexible display screen not only has a lighter and thinner volume, but also can reduce the power consumption, which is helpful for improving battery life of an electronic device. In addition, the flexible display screen can be bended and have good flexibility, so that there is no contradiction between display requirements on high resolution and large size and portability of the device. Furthermore, the flexible display screen is more durable than the conventional display screen, and accidental damage to the display device can be reduced.

The flexible display screen can be applied in a wide range of fields due to its bendability. Currently, a variety of flexible display screen technologies as well as corresponding mobile terminals and wearable devices have been developed. A conventional bending mechanism for the flexible display screen is typically complicated and has a large volume. Usually the bending mechanism is realized by stepper motor driving and electromagnetic absorption. Therefore, it becomes a new development direction of the field to achieve the bending mechanism with small size and related flexible display device.

SUMMARY

Embodiments of the present disclosure provide a bending adjustment device, related flexible display device, and a manufacturing method thereof. The bending adjustment device can easily and precisely control the bending of a flexible display screen, and has a small size.

According to one aspect of the present disclosure, there is provided a bending adjustment device. The bending adjustment device may comprise a plurality of conduits arranged in parallel, a plurality of air bags, wherein at least one air bag is disposed between adjacent conduits of the plurality of conduits, and at least one air sucking and charging apparatus connected to the plurality of conduits at their ends. The other ends of the plurality of conduits are closed. The at least one air sucking and charging apparatus is configured to suck or charge air from or to the plurality of air bags through the plurality of conduits, such that the plurality of air bags contract or expand between the adjacent conduits.

According to some embodiments of the present disclosure, the other ends of the plurality of conduits are connected to the at least one air sucking and charging apparatus.

According to some embodiments of the present disclosure, the bending adjustment device further comprises a controller configured to control the at least one air sucking and charging apparatus to suck or charge the air from or to the plurality of conduits.

According to some embodiments of the present disclosure, the air bag is designed to be in a corrugated shape.

According to some embodiments of the present disclosure, a cross section of the air bag is circular, elliptical, square, rectangular or rhombic.

According to some embodiments of the present disclosure, the air bag is made of polyethylene, polypropylene, or polyester.

According to some embodiments of the present disclosure, the air bag has an air guide tube protruded from its at least one side, and the conduit has a hole or groove accommodating the air guide tube. Alternatively, the air bag has a hole or groove at its at least one side, and the conduit has a protruded air guide tube matching the hole or groove.

According to some embodiments of the present disclosure, the plurality of conduits are arranged with equal space.

According to another aspect of the present disclosure, there is provided a flexible display device. The flexible display device comprises the bending adjustment device as described above and a flexible display screen. The bending adjustment device is disposed on the back surface of the flexible display screen.

According to some embodiments of the present disclosure, a plurality of conduits of the bending device are adhered to or plugged into the back surface of the flexible display screen. Alternatively, the plurality of conduits are coupled to the back surface of the flexible display screen through at least one coupler.

According to some embodiments of the present disclosure, the plurality of conduits and the at least one coupler are formed integrally.

According to some embodiments of the present disclosure, the flexible display device further comprises a tension sensor disposed on the front surface or back surface of the flexible display screen and configured to detect a tension applied to the flexible display screen. The air sucking and charging apparatus of the bending adjustment device is configured to suck or charge air from or to the plurality of conduits according to the detected result of the tension sensor.

According to another aspect of the present disclosure, there is provided a manufacturing method for the flexible display device as described above. In the manufacturing method, a plurality of conduits are arranged in parallel on the back surface of the flexible display screen. Then, at least one air sucking and charging apparatus is connected to the plurality of conduits at their ends, and the other ends of the plurality of conduits are sealed. Then, at least one air bag is disposed between the adjacent conduits of the plurality of conduits and connected to the conduits adjacent thereto.

According to some embodiments of the present disclosure, the plurality of conduits are adhered to or plugged into the back surface of the flexible display screen. Alternatively, the plurality of conduits are coupled to the back surface of the flexible display screen through at least one coupler.

According to some embodiments of the present disclosure, the plurality of conduits and the at least one coupler are formed integrally.

According to some embodiments of the present disclosure, in the manufacturing method, a tension sensor is disposed on the front surface or back surface of the flexible display screen to detect a tension applied to the flexible display screen.

BRIEF DESCRIPTION OF THE DRAWINGS

In order to describe the technical solutions of the embodiments of the present disclosure more clearly, drawings of the embodiments will be briefly described below. It will be appreciated that the drawings described below merely relate to some embodiments of the present invention, other than restrictions to the present invention.

DETAILED DESCRIPTION

Figure 1:
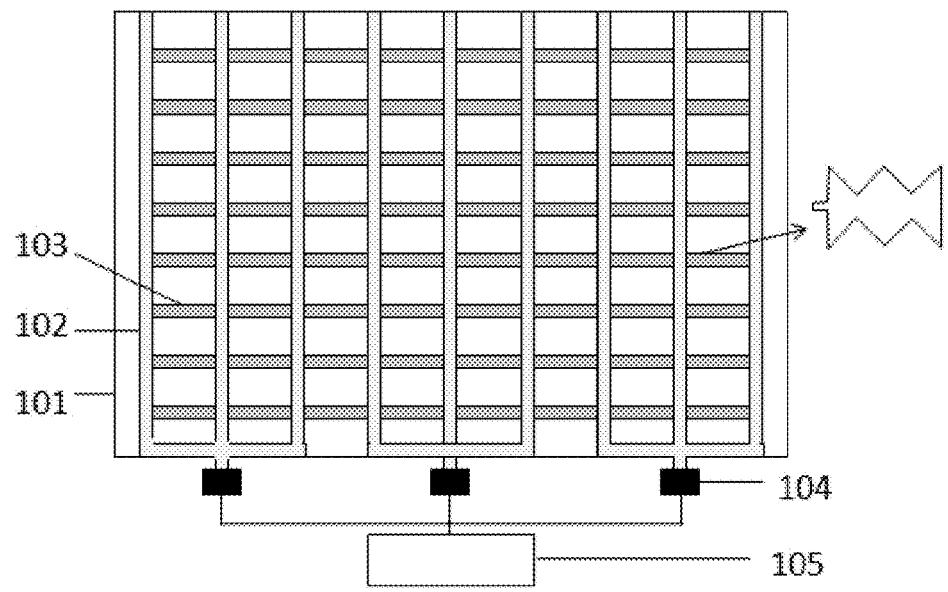
FIG. 1 is a rear view of the flexible display device with the bending adjustment device according to an exemplary embodiment of the present disclosure.

In order to clarify the objective, technical solution and advantages of the embodiments of the present disclosure, the technical solutions of the embodiments of the present disclosure will be clearly and completely described in conjunction with the drawings below. Obviously, the embodiments to be described refer to a part of the embodiments of the present disclosure, other than all of the embodiments. On the basis of the embodiments of the present disclosure, all other embodiments those skilled in the art obtain requiring no inventive effort also belong to the scope protected by the present disclosure.

In the description of the present disclosure, it should be noted that directional or positional relationships shown by terms such as "upper", "lower", "top" and "bottom" etc. are directional or positional relationships shown as in the drawings, which only means to facilitate description of the disclosure and simplify the description, but do not indicate or imply that the devices or components must have specific directions, or be constructed or operated in the specific directions, and are not limitative of the disclosure.

Furthermore, in the description of the present disclosure, unless otherwise stated, the term "a plurality of" refers to two or more.

FIG. 1 shows the flexible display device with the bending adjustment device according to an exemplary embodiment of the present disclosure. As shown in FIG. 1, the flexible display device may comprise a flexible display screen 101 and a bending adjustment device disposed on the back surface of the flexible display screen.

Referring to FIG. 1, the bending adjustment device may comprise a plurality of conduits 102, a plurality of air bags 103, at least one air sucking and charging apparatus 104 and a controller 105. The plurality of conduits 102 (e.g. nine conduits, in FIG. 1) are arranged in parallel and are disposed on the back surface of the flexible display screen 101. The plurality of air bags (e.g. eight air bags, in FIG. 1) are disposed between the adjacent conduits 102. The nine conduits 102 are connected to a plurality of air sucking and charging apparatuses 104 (e.g. three air sucking and charging apparatuses in FIG. 1) at their ends, and the other ends of these conduits 2 are closed. The three air sucking and charging apparatuses 104 are connected to the controller 105.

It should be noted that, although FIG. 1 shows every three adjacent conduits 102 are connected to one air sucking and charging apparatus 104, those skilled in the art will appreciate that a plurality of conduits 102 may be connected to a plurality of air sucking and charging apparatuses 104 in other ways. For instance, it is possible to connect six conduits close to the edges of the flexible display screen 101 to one air sucking and charging apparatuses 104, and connect three conduits in the middle of the flexible display screen 101 to one air sucking and charging apparatus 104.

Figure 2:
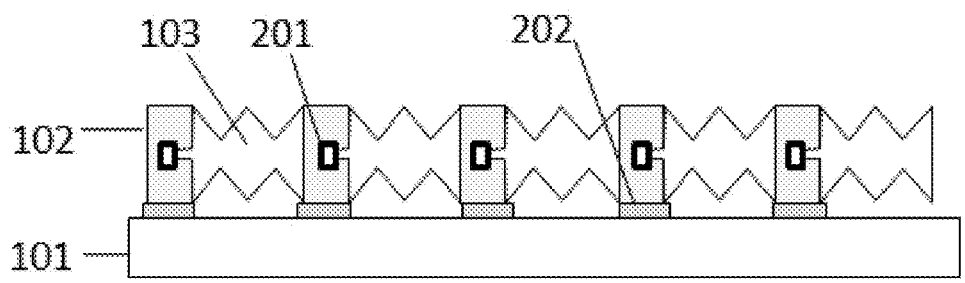
FIG. 2 is a sectional schematic diagram of the flexible display device with the bending adjustment device according to the exemplary embodiment of the present disclosure.

Referring to FIG. 2, the conduit 102 may comprise a channel 201 and a tube wall surrounding the channel 201. The conduit 102 may be in a rectangular shape as a whole. Those skilled in the art will appreciate that the conduit 102 may be designed to be in other geometrical shape.

Furthermore, bottom surfaces of a plurality of conduits 102 may be coupled to the back surface of the flexible display screen 101 through a coupler 202. The air bag 103 may expand or contract in a direction substantially perpendicular to the conduit 102. Specifically, the air bag 103 may have an air guide tube protruded from its left side, while the conduit 102 may have a hole or groove accommodating the air guide tube, so that the air bag 103 may be connected to the channel 201 of the conduit 102. Those skilled in the art will appreciate that the connection between the air bag 103 and the channel 201 of the conduit 102 is not limited to this. In some embodiments, the air bag 103 may be provided with the hole or groove at its one side, while the conduit 102 may be provided with the air guide tube matching the hole or groove.

Those skilled in the art will appreciate that the exemplary embodiment above is only the illustration of the present disclosure, but not the limitation. In some embodiments of the present disclosure, the numbers of the conduits 102, air bags 103 and air sucking and charging apparatuses 104 may be different from the numbers in the exemplary embodiment above.

In some embodiments of the present disclosure, the bottom surfaces of a plurality of conduits 102 may be directly adhered to the back surface of the flexible display screen 101. Alternatively, the air bag 103 may be in connection with the channel 201 of the conduit 102 at its right side, or the air bag 103 may be in connection with the channels 201 of the adjacent two conduits 102.

As shown in FIG. 1, the conduits 102 are arranged with equal space, but those skilled in the art will appreciate that the conduits may be arranged with unequal space. For instance, the space between the adjacent conduits 102 in the middle of the flexible display screen 101 may be larger, and the space between the adjacent conduits 102 close to the edge of the flexible display screen 101 may be smaller.

Alternatively, the space between the adjacent conduits 102 in the middle of the flexible display screen 101 may be smaller, and the space between the adjacent conduits 102 close to the edge of the flexible display screen 101 may be larger.

Figure 6:
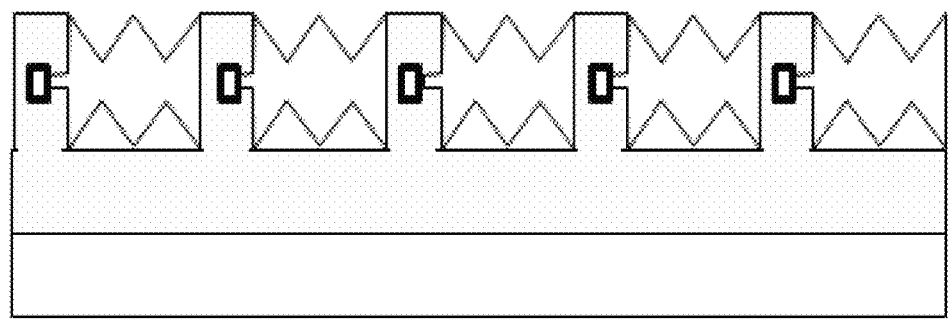
FIG. 6 is a sectional schematic diagram of the flexible display device with the bending adjustment device according to another exemplary embodiment of the present disclosure.

In FIG. 2, the bottom surfaces of a plurality of conduits 102 are respectively coupled to the back surface of the flexible display screen 101 through the respective couplers 202. In FIG. 6, only one coupler is disposed on the back surface of the flexible display screen 101. The bottom surfaces of a plurality of conduits 102 are coupled to the back surface of the flexible display screen 101 through this coupler. In this case, the coupler may be integrally formed with the plurality of conduits 102. Furthermore, the bottom surfaces of the conduits 102 may be directly coupled to the back surface of the flexible display screen 101.

In some embodiments of the present disclosure, the bottom surfaces of the conduits 102 may be adhered to or plugged into the back surface of the flexible display screen 101 with glue or other adhesives. Accordingly, the conduits 102 may be coupled to the coupler and the coupler may be coupled to the back surface of the flexible display screen 101 in the similar way.

Figure 5:
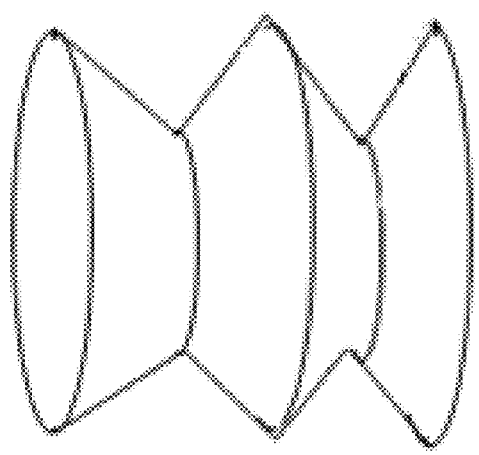
FIG. 5 is a schematic diagram of the air bag used in the flexible display device according to the exemplary embodiment of the present disclosure.

Referring to FIG. 2 again, the air bag 103 may be designed to be in a corrugated shape in the direction substantially perpendicular to the conduit 102. For instance, the upper outline and lower outline of the air bag 103 are in a symmetrical serrated form. Similarly, the upper outline and lower outline of the air bag 103 may be in a symmetrical wave form. As shown in FIG. 5, the cross section of the air bag may be circular. Those skilled in the art will appreciate that the cross section of the air bag may be in other shapes such as oval, square, rectangle, rhombus, etc. Furthermore, the air bag may be made of materials such as polyethylene, polypropylene, or polyester.

Figure 3:
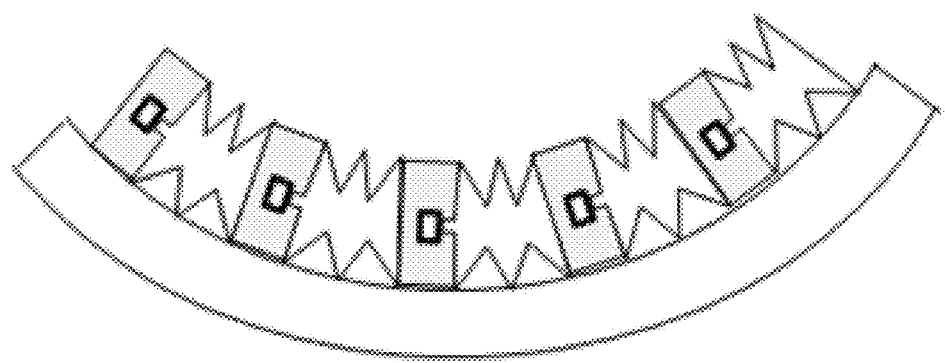
FIG. 3 is a diagram illustrating the state of the flexible display device when the air bags contract according to the exemplary embodiment of the present disclosure.
Figure 4:
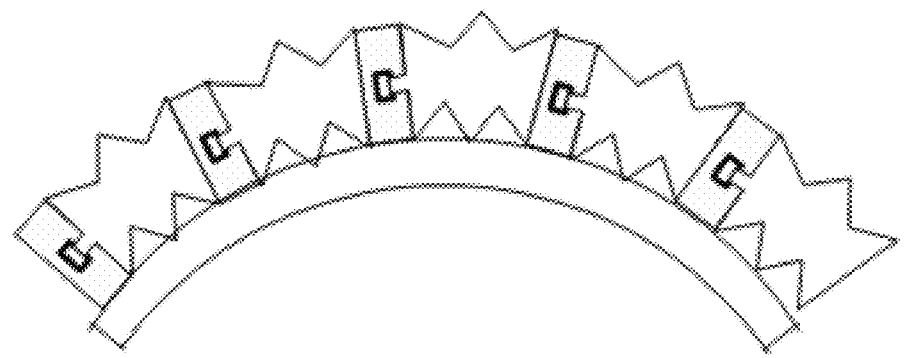
FIG. 4 is a diagram illustrating the state of the flexible display device when the air bags expand according to the exemplary embodiment of the present disclosure.

FIG. 3 and FIG. 4 respectively show the states of the flexible display device when the air bags contract and expand according to the exemplary embodiment of the present disclosure.

As shown in FIG. 3, when the flexible display screen 101 needs to be bended towards the back surface, the controller 105 may control the air sucking and charging apparatuses 104 to suck the air, so that the air bags 103 contract. The contraction of the air bags 103 may generate a pulling force on the adjacent conduits 102 to generate the conduits 102 to tilt inward, so that the flexible display screen 101 may be bended towards the back surface.

As shown in FIG. 4, when the flexible display screen 101 needs to be bended towards the front surface, the controller 105 may control the air sucking and charging apparatuses 104 to charge the air, so that the air bags 103 expand. The expansion of the air bags 103 may generate a pushing force on the adjacent conduits 102 to cause the conduits 102 to tilt outward, so that the flexible display screen 101 may be bended towards the front surface.

Although the conduits are arranged with equal space in FIGS. 3 and 4, the conduits may be arranged with unequal space to control the curvature of the flexible display screen 101 more precisely.

Furthermore, the bending adjustment device may comprises one or more tension sensors (not shown) disposed on the front surface or back surface of the flexible display screen 101 to detect a tension applied to the flexible display screen 101. The controller 105 may control the air sucking and charging apparatus 104 to suck or charge the air according to the detected result of the tension sensor.

Next the manufacturing method for the flexible display device with the bending adjustment device according to an exemplary embodiment of the present disclosure will be described.

Firstly, a plurality of conduits 102 may be arranged in parallel on the back surface of the flexible display screen 101. In this step, the plurality of conduits 102 may be adhered to or plugged into the back surface of the flexible display screen 101 with glue or other adhesives. In another embodiment, a plurality of conduits 102 may be coupled to the back surface of the flexible display screen through at least one coupler. Specifically, the plurality of conduits 102 and the coupler may be formed integrally, and then may be adhered to or plugged into the back surface of the flexible display screen 101 with glue or other adhesives.

Secondly, the plurality of conduits 102 may be connected to at least one air sucking and charging apparatus 104 at their ends, and the other end of each of the plurality of conduits 102 is sealed. Then, at least one air bag 103 is disposed between the adjacent conduits of the plurality of conduits 102. The air bag 103 is in connection with the conduits adjacent thereto. Specifically, the air bag 103 may be provided with the air guide tube at its left side. Then the air guide tube may be inserted into the hole or groove of the conduit 102 at the left side of the air bag 103, so that the air bag 103 may be in connection with the channel 201 of the conduit 102.

Furthermore, one or more tension sensors may be disposed on the front surface or back surface of the flexible display screen 101 to detect the tension applied to the flexible display screen 101.

The embodiments of the present disclosure have been described above, but the scope of the present disclosure is not limited to this. Any modification, variation or substitution may be made without departing from the technical spirit and scope of the present disclosure, which shall fall within the scope of the present disclosure. The scope of the present disclosure is defined by the appended claims.

What is claimed is:

1. A bending adjustment device, comprising:
 a plurality of conduits arranged in parallel;
 a plurality of air bags, wherein at least one air bag is disposed between adjacent conduits of the plurality of conduits; and
 at least one air sucking and charging apparatus connected to the plurality of conduits at their ends;
 wherein the other ends of the plurality of conduits are closed, and wherein the at least one air sucking and charging apparatus is configured to suck or charge air from or to the plurality of air bags through the plurality of conduits, such that the plurality of air bags contract or expand between the adjacent conduits.

2. The bending adjustment device according to claim 1, wherein the other ends of the plurality of conduits are connected to the at least one air sucking and charging apparatus.

3. The bending adjustment device according to claim 1, further comprising a controller configured to control the at least one air sucking and charging apparatus to suck or charge the air from or to the plurality of conduits.

4. The bending adjustment device according to claim 1, wherein the air bag is designed to be in a corrugated shape.

5. The bending adjustment device according to claim 1, wherein a cross section of the air bag is circular, elliptical, square, rectangular or rhombic.

6. The bending adjustment device according to claim 1, wherein the air bag is made of polyethylene, polypropylene, or polyester.

7. The bending adjustment device according to claim 1, wherein the air bag has an air guide tube protruded from its at least one side, and wherein the conduit has a hole or groove accommodating the air guide tube; or
- wherein the air bag has a hole or groove at its at least one side, and wherein the conduit has a protruded air guide tube matching the hole or groove.

8. The bending adjustment device according to claim 1, wherein the plurality of conduits are arranged with equal space.

9. A flexible display device, comprising:
- a bending adjustment device according to claim 1; and
- a flexible display screen;
- wherein the bending adjustment device is disposed on the back surface of the flexible display screen.

10. The flexible display device according to claim 9, wherein a plurality of conduits of the bending adjustment device are adhered to or plugged into the back surface of the flexible display screen, or wherein the plurality of conduits are coupled to the back surface of the flexible display screen through at least one coupler.

11. The flexible display device according to claim 10, wherein the plurality of conduits and the at least one coupler are formed integrally.

12. The flexible display device according to claim 9, further comprising a tension sensor disposed on the front surface or back surface of the flexible display screen and configured to detect a tension applied to the flexible display screen;
- wherein at least one air sucking and charging apparatus of the bending adjustment device is configured to suck or charge air from or to the plurality of conduits according to the detected result of the tension sensor.

13. A manufacturing method for the flexible display device according to claim 9, comprising:
- arranging a plurality of conduits in parallel on the back surface of the flexible display screen;
- connecting at least one air sucking and charging apparatus to the plurality of conduits at their ends, and sealing the other ends of the plurality of conduits; and
- disposing at least one air bag between the adjacent conduits of the plurality of conduits and connecting the air bag to the conduits adjacent thereto.

14. The manufacturing method according to claim 13, wherein the plurality of conduits are adhered to or plugged into the back surface of the flexible display screen; or
- wherein the plurality of conduits are coupled to the back surface of the flexible display screen through at least one coupler.

15. The manufacturing method according to claim 14, wherein the plurality of conduits and the at least one coupler are formed integrally.

16. The manufacturing method according to claim 13, further comprising:
- disposing a tension sensor on the front surface or back surface of the flexible display screen to detect a tension applied to the flexible display screen.

17. The bending adjustment device according to claim 2, further comprising a controller configured to control the at least one air sucking and charging apparatus to suck or charge the air from or to the plurality of conduits.

18. The bending adjustment device according to claim 2, wherein the air bag has an air guide tube protruded from its at least one side, and wherein the conduit has a hole or groove accommodating the air guide tube; or
- wherein the air bag has a hole or groove at its at least one side, and wherein the conduit has a protruded air guide tube matching the hole or groove.

19. The bending adjustment device according to claim 3, wherein the air bag has an air guide tube protruded from its at least one side, and wherein the conduit has a hole or groove accommodating the air guide tube; or
- wherein the air bag has a hole or groove at its at least one side, and wherein the conduit has a protruded air guide tube matching the hole or groove.

20. The bending adjustment device according to claim 17, wherein the air bag has an air guide tube protruded from its at least one side, and wherein the conduit has a hole or groove accommodating the air guide tube; or
- wherein the air bag has a hole or groove at its at least one side, and wherein the conduit has a protruded air guide tube matching the hole or groove.

* * * * *